(12) United States Patent
Liu

(10) Patent No.: US 6,190,938 B1
(45) Date of Patent: Feb. 20, 2001

(54) CROSS GRID ARRAY PACKAGE STRUCTURE AND METHOD OF MANUFACTURE

(75) Inventor: Hermen Liu, Taoyuan Hsien (TW)

(73) Assignee: United Microelectronics Corp., Hsinchu (TW)

(*) Notice: Under 35 U.S.C. 154(b), the term of this patent shall be extended for 0 days.

(21) Appl. No.: 09/095,403

(22) Filed: Jun. 10, 1998

(30) Foreign Application Priority Data

Feb. 20, 1998 (TW) .................................................. 87102396

(51) Int. Cl.[7] .............................. H01L 21/44; H01L 21/48
(52) U.S. Cl. ........................ 438/106; 438/123; 438/124; 438/127
(58) Field of Search ................................ 438/106, 25, 26, 438/107, 111, 123, 124, 125, 126, 178, 127

(56) References Cited

U.S. PATENT DOCUMENTS

| | | | |
|---|---|---|---|
| 4,994,895 | * 2/1991 | Matsuzaki et al. | 257/791 |
| 5,321,204 | * 6/1994 | Ko | 174/52.4 |
| 5,386,141 | * 1/1995 | Liang et al. | 257/676 |
| 5,463,247 | * 10/1995 | Futatsuka et al. | 257/666 |
| 5,633,206 | * 5/1997 | Kim et al. | 29/827 |
| 5,648,682 | * 7/1997 | Nakazawa et al. | 257/673 |

\* cited by examiner

*Primary Examiner*—Trung Dang
*Assistant Examiner*—Brook Kebede

(57) ABSTRACT

An interlace grid array package structure and method of manufacture that utilizes a single sided molding method whose connection with an integrated circuit board is through the underside of the package's plastic body. Therefore, only the alternating contact points arranged into a grid array are exposed for connection after a surface mount operation. Hence, the leads of a lead frame are not protrudent. Therefore, the problem of bent leads is eliminated and the overall package area and thickness is reduced. Since the alternating contact point design of a grid array package increases connection pitch, short-circuiting of neighboring contact points is greatly reduced and a higher yield is obtained.

20 Claims, 3 Drawing Sheets

CROSS GRID ARRAY PACKAGE STRUCTURE AND METHOD OF MANUFACTURE

CROSS-REFERENCE TO RELATED APPLICATION

This application claims the priority benefit of Taiwan application serial no. 87102396, filed Feb. 20, 1998, the full disclosure of which is incorporated herein by reference.

BACKGROUND OF THE INVENTION

1. Field of Invention

The present invention relates to a type of package structure suitable for surface mount technology. More particularly, the present invention relates to a type of package structure whose lead frame leads are not directly protrudent to the outside. Furthermore, the leads are positioned alternately so that the external connection points are distributed further apart.

2. Description of Related Art

Integrated circuits (ICs) are so common that they are used in every aspect of our lives. However, to fabricate an IC, hundreds of steps have to be taken over a period of one to two months. Fundamentally, the IC industry involves four major branches including IC design, wafer fabrication, wafer testing and wafer packaging. To maintain the IC industry, requires investment of research capital and constant development of advanced technologies. Therefore, the IC industry is a high-risk business.

In general, IC production can be subdivided into three stages, namely, the silicon wafer fabrication stage, the integrated circuit fabrication stage and the IC chip packaging stage. The packaging of the IC chip is really the last step in the fabrication of an integrated circuit product. From years of packaging practices, the packaging method and external appearance have mostly been standardized.

Due to rapid development in integrated circuit technology, conventional packaging methodology using a lead frame, for example, the dual inline package (DIP), is unable to meet the demands of more advanced processing methods. At present, most semiconductor manufacturers are utilizing surface mount technology (SMT) in their fabrication. Surface mount technique is able not only to eliminate drilling of lots of holes in the circuit board, but is also capable of reducing the lead pitch between the metallic leads when the lead frame is packed into a package having, for example, gull wing leads or J-leads. In view of the convenience of using surface mount technologies, the following discussion is based on surface mount IC fabrication method.

For example, the conventional method of packaging a lead frame into a package having gull wing leads is illustrated in FIGS. 1A and 1B below. FIG. 1A and FIG. 1B are the respective side view and top view of a conventional IC package having gull wing leads. In FIGS. 1A and 1B, a package can be divided into a plastic body 10 and external metal leads 11. As shown in FIG. 1B, the distance, separating one lead from its neighbor, called lead pitch 12, cannot be too small. If lead pitch 12 is too small, short-circuiting of neighboring leads 11 can easily occur when the subsequent surface mount operation is carried out, thereby leading to a drop in the yield.

In addition, conventional lead frame is packaged using a dual side molding process. Therefore, the metallic leads 11 protrude from the plastic body 10, and the package is connected with the IC board by the portions of the metal leads protruding from the plastic body. If the metallic leads are not properly handled, the leads may be bent. Hence, the yield from the surface mount operation is lowered.

Another conventional packaging method is the grid array packaging method. In this method, connection between the IC board and the package is through the underside of the plastic body. The contact points layout of the conventional grid array package is column type. Although the problem of bent leads is solved by this type of arrangement, its column grid array structure makes it difficult to implement further reduction of distance between neighboring contact points without causing shortcircuiting. Hence, the yield of this packaging method is still low.

In summary, defects in the conventional method of packaging include:

(1) As the distance separating neighboring leads is reduced, short-circuiting between neighboring leads easily occurs after the package is attached to an IC board using a surface mount technique. Hence, the overall yield of the process is low.

(2) Because the method of attaching the package onto an IC board is through metal leads protruding from a plastic body, the metal leads can be bent when the package is improperly handled. This will contribute to failure in lead attachment after going through a surface mount operation.

In light of the foregoing, there is a need to provide a better method of packaging an IC chip that can produce a higher yield rate using surface mount technology.

SUMMARY OF THE INVENTION

Accordingly, the present invention is to provide an interlace grid array package structure and method of manufacture that can increase the pitch of neighboring contact points so that short-circuiting between neighboring leads is greatly reduced after attachment of the package to an IC board using a surface mount technique, thereby increasing the product yield.

In another aspect, this invention is to provide an interlace grid array package structure whose connection with an IC board is through the underside of the plastic body. Hence, the metal leads of lead frame are not exposed, thereby avoiding the problem of bent leads and reducing overall packaging area and thickness.

To achieve these and other advantages and in accordance with the purpose of the invention, as embodied and broadly described herein, the invention provides a method of manufacturing an interlace grid array package. The method comprises the steps of first providing a lead frame and an interlace grid array tape, where the lead frame at least includes a die paddle and a plurality of leads, and where the interlace grid array tape has a plurality of holes formed thereon. Next, the interlace grid array tape is attached to one side of the lead frame, wherein each hole on the interlace grid array tape is matched in position against a corresponding lead of the lead frame. Subsequently, die attach, wire bonding and molding processes are sequentially carried out on the other side of the lead frame. The interlace grid array packaging method provided by this invention also permits the die attach, wire bonding and molding processes to be performed on one side of the lead frame first, before attaching the interlace grid array tape on the other side of the lead frame.

In yet another aspect, this invention provides an interlace grid array package structure comprising the following: a lead frame having a first side and a second side, the lead frame also including a die paddle and a plurality of leads; a silicon chip located above the die paddle on the first side of the lead frame, with the silicon chip electrically connected to the lead frame; a packaging material for enclosing the silicon chip and the first side of the lead frame; and an interlace grid array tape having a plurality of holes arranged alternately, whose positions correspond to the leads of the lead frame.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
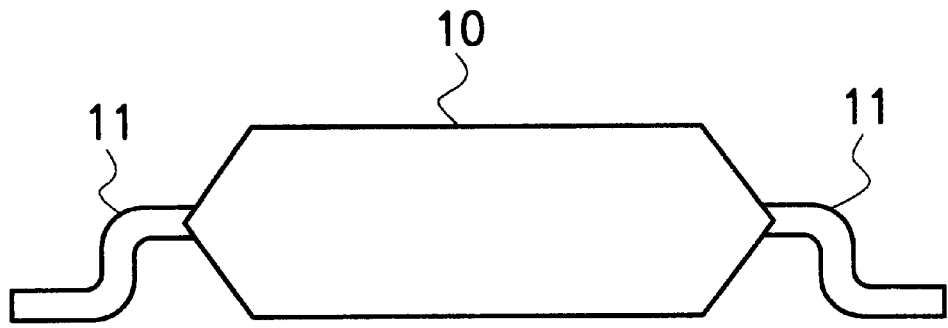
FIG. 1A is a side view of a conventional IC package having gull wing leads.
Figure 1B:
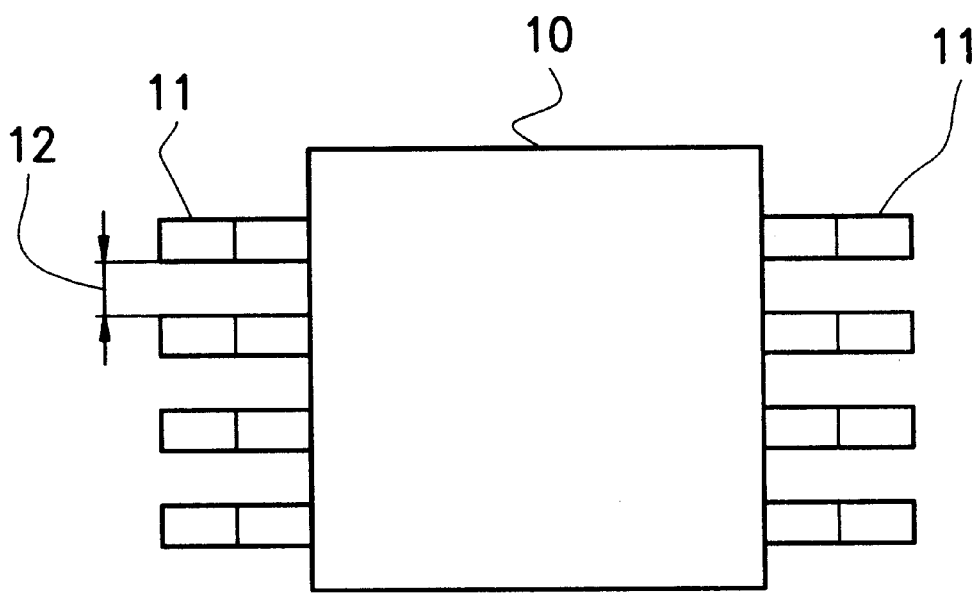
FIG. 1B is a top view of a conventional IC package having gull wing leads.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
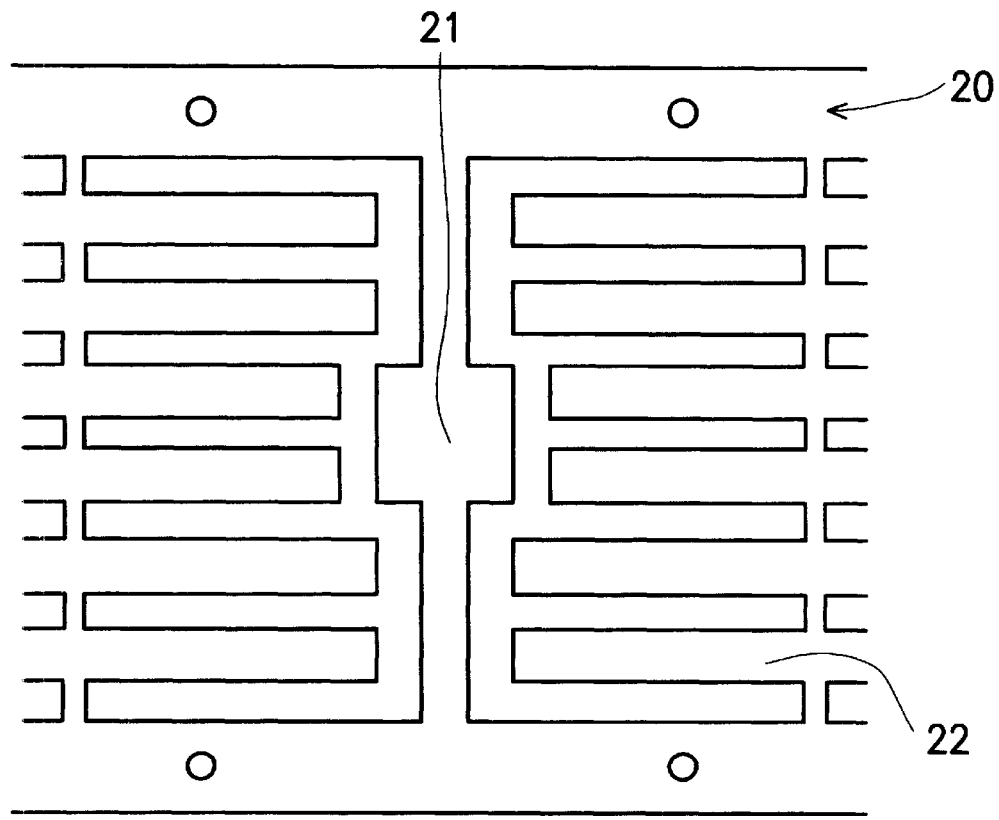
FIGS. 2A through 2C are diagrams showing various components of a interlace grid array package according to one preferred embodiment of this invention.
Figure 2B:
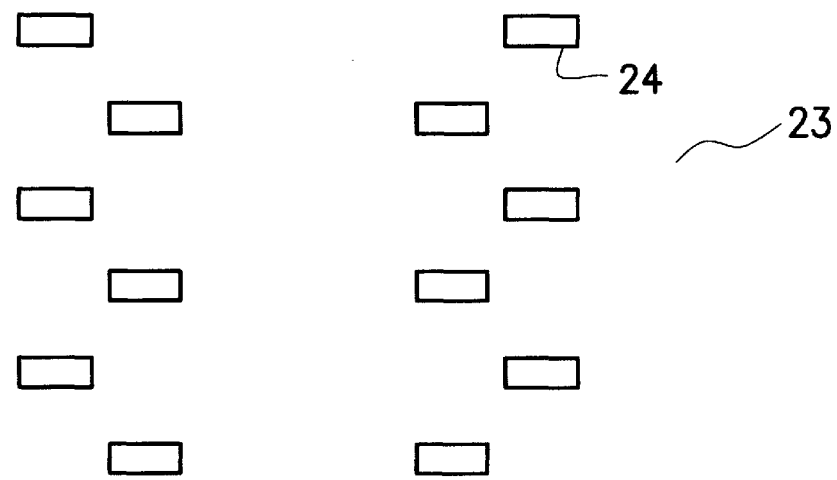
Figure 2C:
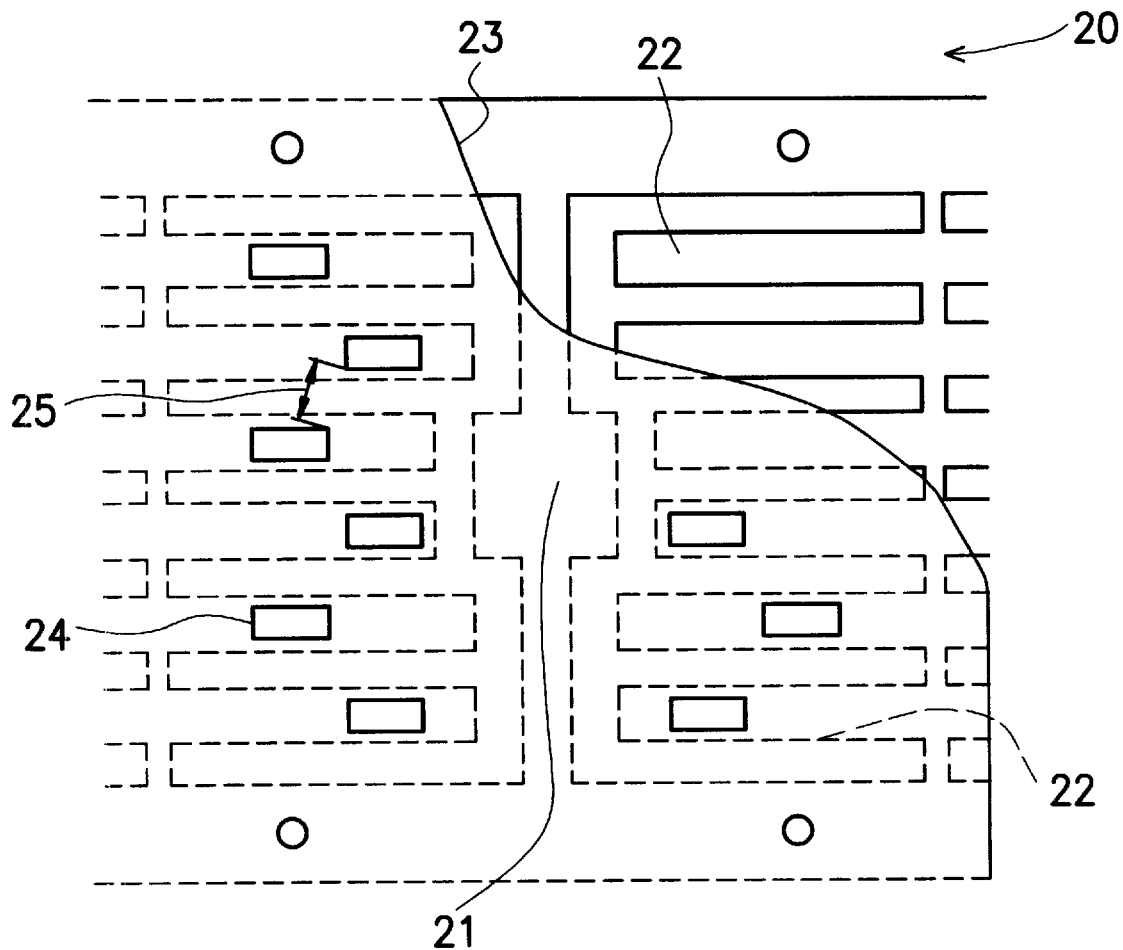

FIGS. 2A through 2C are diagrams showing various components of a interlace grid array package according to one preferred embodiment of this invention.

The method of fabricating the interlace grid array package includes first providing a lead frame 20 (shown in FIG. 2A) and a interlace grid array tape 23 (shown in FIG. 2B). The lead frame 20 can be subdivided into two regions, namely, a die paddle 21 and leads 22. The lead frame 20 is made from a copper (Cu) material or an alloy. The interlace grid array tape 23 has a plurality of holes 24 formed thereon, and is made from a polymer material such as polyimide that has low affinity for lead/tin (Pb/Sn) material.

Next, the interlace grid array tape 23 is attached to one side of the lead frame 20, where the holes 24 on the interlace grid array tape 23 must correspond in position to the leads 22 of the lead frame 20 as shown in FIG. 2C. Because the layout of the holes 24 is interlace, the pitch 25 between every two adjacent holes 24 is longer than that of a conventional package.

Thereafter, subsequent packaging processes are performed on the other side of the lead frame 20. For example, die attaching, wire bonding and plastic molding or flip chip processes are carried out sequentially. Finally, a interlace grid array package having a cross-section as shown in FIG. 2D is created.

Obviously, this invention also permits die attach, wire bonding and plastic molding or flip chip processes to be carried out first before the interlace grid array tape 23 is attached to the other side of the lead frame 20.

Figure 2D:
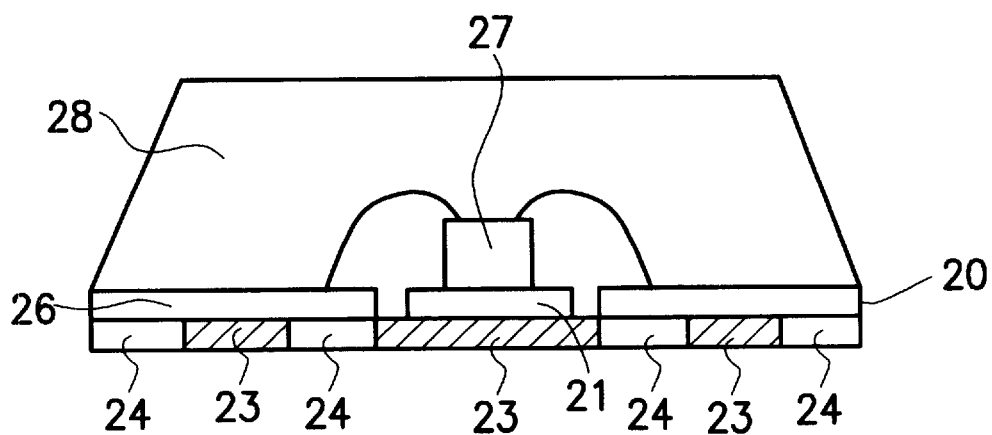
FIG. 2D is a cross-sectional view showing a interlace grid array package fabricated according to one preferred embodiment of this invention.

In addition, this invention provides a interlace grid array package structure whose details are shown in FIG. 2D. The interlace grid array package structure comprises the following: a lead frame 20 having a die paddle 21 and a plurality of leads 26. A wafer chip 27 is located above the die paddle 21 on a first side of the lead frame 20, where the wafer chip 27 is electrically connected to the lead frame 20. The method of connection includes flip chip or wire bonding (shown in FIG. 2D). A packaging material 28 encloses the wafer chip 27 and the first side of the lead frame 20, wherein the packaging material 28 includes resins, plastics or ceramics. An interlace grid array tape 23 having a plurality of holes 24 is arranged alternatively and is able to match in positions with corresponding leads 26 of the lead frame 20.

Furthermore, this invention employs a single-sided molding operation with an additional interlace grid array tape attached to the bottom part of the lead frame. With this arrangement, the bottom part of the lead frame will be exposed in alternative locations to form an interlace grid array after going through a surface mount operation. Therefore, external connection pitch will be increased. Hence, the yield of a surface mount operation can be increased and lead-bending problems can be avoided. Above all, the packaging area and thickness of the package as a whole can be reduced.

In summary, the advantages of an interlace grid array package includes:

(1) The external connection pitch is increased and short-circuiting between adjacent leads after the package is attached to an IC board using a surface mount technique is low. Hence, the overall yield of the process is high.

(2) The method of attaching the package onto an IC board is through the underside of the plastic package. Since only contact points are alternately exposed in the form of a grid array after a surface mount operation, bending of leads due to lead protruding from the package can be avoided. Hence, the packaging area and thickness of the package as a whole can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An interlace grid array packaging method comprising the steps of:

providing a lead frame and an interlace grid array tape, wherein the lead frame at least includes a die paddle and a plurality of leads, and the interlace grid array tape has a plurality of holes arranged alternately into a grid array;

attaching the interlace grid array tape to one side of the lead frame, wherein the holes of the interlace grid array tape are able to match in positions to the respective leads of the lead frame; and performing a series of packaging operations on other side of the lead frame, whereby a wafer chip is attached to the other side of the lead frame.

2. The method of claim 1, wherein the material for forming the lead frames includes copper.

3. The method of claim 1, wherein the material for forming the lead frames includes alloy.

4. The method of claim 1, wherein the material for forming the interlace grid arrays tape includes polyimide.

5. The method of claim 1, wherein the material for forming the interlace grid arrays tape includes a polymer material.

6. The method of claim 1, wherein the material for forming the interlace grid array tape includes a substance that has a low affinity for soldering compound.

7. The method of claim 1, wherein the number of holes in the interlace grid arrays tape is the same as the number of leads in the lead frame.

8. The method of claim 1, wherein the number of holes in the interlace grid array tape is different from the number of leads in the lead frame.

9. The method of claim 1, wherein the step of performing a series of packaging operations includes a die attach, wire bonding and plastic molding.

10. The method of claim 1, wherein the step of performing a series of packaging operations includes a flip chip process and plastic molding.

11. An interlace grid array packaging method comprising the steps of:

providing a lead frame having at least a die paddle and a plurality of leads, and then performing packaging operations on one side of the lead frame, whereby a wafer chip is attached to the one side of the lead frame; and attaching an interlace grid array tape on the other side of the lead frame, wherein the interlace grid array tape has a plurality of holes arranged alternately into a grid array, and the holes of the interlace grid array tape are able to match in positions to the respective leads of the lead frame.

12. The method of claim 11, wherein the material for forming the lead frames includes copper.

13. The method of claim 11, wherein the material for forming the lead frames includes alloy.

14. The method of claim 11, wherein the material for forming the interlace grid array tape includes polyimide.

15. The method of claim 11, wherein the material for forming the interlace grid array tape includes a polymer material.

16. The method of claim 11, wherein the material for forming the interlace grid array tape includes a substance that has a low affiliation for soldering compound.

17. The method of claim 11, wherein the number of holes in the interlace grid array tape is the same as the number of leads in the lead frame.

18. The method of claim 11, wherein the number of holes in the interlace grid array tape is different from the number of leads in the lead frame.

19. The method of claim 11, wherein the step of performing a series of packaging operations includes a die attach, wire bonding and plastic molding.

20. The method of claim 11, wherein the step of performing a series of packaging operations includes a flip chip process and plastic molding.

* * * * *